(12) United States Patent
Dan et al.

(10) Patent No.: US 11,146,090 B2
(45) Date of Patent: Oct. 12, 2021

(54) BATTERY MANAGEMENT SYSTEM, AND METHOD AND APPARATUS FOR TRANSMITTING INFORMATION

(71) Applicant: Contemporary Amperex Technology Co., Limited, Ningde (CN)

(72) Inventors: Zhimin Dan, Ningde (CN); Wenbin Lu, Ningde (CN); Wei Zhang, Ningde (CN); Yizhen Hou, Ningde (CN); Jia Xu, Ningde (CN); Jiechao Luo, Ningde (CN); Teng Yu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 146 days.

(21) Appl. No.: 16/539,996

(22) Filed: Aug. 13, 2019

(65) Prior Publication Data
US 2020/0083730 A1 Mar. 12, 2020

(30) Foreign Application Priority Data
Sep. 12, 2018 (CN) .......................... 201811061368.3

(51) Int. Cl.
*G01R 31/08* (2020.01)
*H04J 1/00* (2006.01)
(Continued)

(52) U.S. Cl.
CPC .......... *H02J 7/0069* (2020.01); *G01R 31/389* (2019.01); *G01R 31/3842* (2019.01);
(Continued)

(58) Field of Classification Search
CPC .... H02J 7/0069; H02J 7/00032; H02J 7/0047; G01R 31/389; G01R 31/392;
(Continued)

(56) References Cited

U.S. PATENT DOCUMENTS

| | | | |
|---|---|---|---|
| 2016/0268642 A1* | 9/2016 | Yamazoe | ............ H01M 10/482 |
| 2018/0123705 A1 | 5/2018 | Henry et al. | |
| 2020/0015091 A1* | 1/2020 | Taskin | .............. H04W 72/0426 |

FOREIGN PATENT DOCUMENTS

| | | |
|---|---|---|
| CN | 102710484 A | 10/2012 |
| CN | 202474974 U | 10/2012 |

(Continued)

OTHER PUBLICATIONS

The First Office Action and search report dated Aug. 31, 2020 for Chinese Application No. 201811061368.3, 10 pages.
(Continued)

*Primary Examiner* — Maharishi V Khirodhar
(74) *Attorney, Agent, or Firm* — Law Offices of Liaoteng Wang (57) ABSTRACT

The present disclosure provides a method for transmitting information in a battery management system. The method includes: determining, from a plurality of slave nodes, a fault slave node that communicates abnormally with a master node in the battery management system; selecting a target slave node from the plurality of slave nodes, wherein the target slave node is a slave node that communicates normally with both the master node and the fault slave node; transmitting frequency conversion information to the target slave node, so that the target slave node forwards the frequency conversion information to the fault slave node, and the fault slave node performs a frequency conversion based on the frequency conversion information; and transmitting information with the fault slave node using a frequency after the frequency conversion. According to embodiments of the present disclosure, the reliability of wireless communication in the battery management system can be improved.

13 Claims, 4 Drawing Sheets

---

500

Determining, from a plurality of slave nodes, a fault slave node that communicates abnormally with a master node in the battery management system

↓

Selecting a target slave node from the plurality of slave nodes, wherein the target slave node is a slave node that communicates normally with both the master node and the fault slave node

↓

Transmitting frequency conversion information to the target slave node, so that the target slave node forwards the frequency conversion information to the fault slave node, and the fault slave node performs a frequency conversion based on the frequency conversion information

↓

Transmitting information with the fault slave node using a frequency after the frequency conversion (51) Int. Cl.
  *H04L 12/16* (2006.01)
  *H02J 7/00* (2006.01)
  *G01R 31/389* (2019.01)
  *G01R 31/3842* (2019.01)
  *G01R 31/392* (2019.01)
  *H04W 52/02* (2009.01)

(52) U.S. Cl.
  CPC ........ *G01R 31/392* (2019.01); *H02J 7/00032* (2020.01); *H02J 7/0047* (2013.01); *H04W 52/0261* (2013.01); *H04Q 2213/13145* (2013.01)

(58) Field of Classification Search
  CPC .......... G01R 31/3842; H04W 52/0261; H04Q 2213/13145
  USPC ......................................... 370/225
  See application file for complete search history.

(56) References Cited

FOREIGN PATENT DOCUMENTS

| | | |
|---|---|---|
| CN | 104506357 A | 4/2015 |
| CN | 105812024 A | 7/2016 |
| CN | 106059879 A | 10/2016 |
| CN | 107911835 A | 4/2018 |
| JP | 2010226318 A | 10/2010 |
| WO | 2015189898 A1 | 12/2015 |

OTHER PUBLICATIONS

The extended European search report dated Feb. 3, 2020 for European Application No. 19192752.4, 5 pages.

* cited by examiner

BATTERY MANAGEMENT SYSTEM, AND METHOD AND APPARATUS FOR TRANSMITTING INFORMATION

CROSS-REFERENCE TO RELATED APPLICATION

This application is based upon and claims priority to Chinese Patent Application No. 201811061368.3, filed on Sep. 12, 2018, the content of which is incorporated herein by reference in its entirety.

FIELD

The present disclosure relates to the technical field of new energy, and in particular, to a battery management system, and a method and apparatus for transmitting information in a battery management system.

BACKGROUND

A battery management system may include a master node and a plurality of slave nodes. The master node and each slave node may use wireless communication technology for data interaction, and may complete tasks such as a command request, data upload, etc. Before normal communication between the master node and the slave nodes, physical serial number coding is required. After the coding is completed, the slave nodes may collect data of a battery such as voltage, temperature, current, diagnosis, etc., and report the data to the master node periodically or based on an event through a wireless signal for the master node to perform data processing and perform corresponding actions.

In the battery management system, if the master node and the slave nodes communicate wirelessly using a wireless signal of a fixed frequency, and there is an interference signal of the same frequency or approximate frequency in the external environment, communication between the master node and the slave nodes will be seriously interfered. Furthermore, due to differences in structural layout of different battery management systems, there may be media between nodes in the battery management system that seriously interfere with wireless communication, which may result in poor communication or communication interruption between the master node and a certain slave node. In addition, since the nodes in the battery management system may cause a multipath fading phenomenon due to reflections from structural members or other nodes, this may also result in poor communication or communication interruption between the master node and a certain slave node. Various communication problems between the master node and the slave nodes caused by different reasons will reduce the reliability of transmitting information in the battery management system.

SUMMARY

According to embodiments of the present disclosure, there is provided a battery management system, and a method and apparatus for transmitting information in a battery management system.

According to an aspect of the embodiments of the present disclosure, there is provided a method for transmitting information in a battery management system. The method may include: determining, from a plurality of slave nodes, a fault slave node that communicates abnormally with a master node in the battery management system; selecting a target slave node from the plurality of slave nodes, wherein the target slave node is a slave node that communicates normally with both the master node and the fault slave node; transmitting frequency conversion information to the target slave node, so that the target slave node forwards the frequency conversion information to the fault slave node, and the fault slave node performs a frequency conversion based on the frequency conversion information; and transmitting information with the fault slave node using a frequency after the frequency conversion.

According to another aspect of the embodiments of the present disclosure, there is provided a method for transmitting information in a battery management system. The method may include: receiving frequency conversion information transmitted by a master node in the battery management system; forwarding the frequency conversion information to a fault slave node, so that the fault slave node performs a frequency conversion based on the frequency conversion information, and the master node transmits information with the fault slave node using the frequency after the frequency conversion, wherein the fault slave node is a slave node, determined by the master node from a plurality of slave nodes, that communicates abnormally with the master node.

According to yet another aspect of the embodiments of the present disclosure, there is provided a method for transmitting information in a battery management system. The method may include: receiving frequency conversion information transmitted by a target slave node, wherein the target slave node is a slave node selected from a plurality of slave nodes by a master node in the battery management system, and the target slave node is a slave node that communicates normally with both the master node and a fault slave node, and wherein the fault slave node is a slave node, determined by the master node from the plurality of slave nodes, that communicates abnormally with the master node; and performing a frequency conversion based on the frequency conversion information, so that the master node uses a frequency after the frequency conversion to transmit information with the fault slave node.

According to yet another aspect of the embodiments of the present disclosure, there is provided an apparatus for transmitting information in a battery management system. The apparatus may include: a fault slave node determination module configured to determine, from a plurality of slave nodes, a fault slave node that communicates abnormally with a master node in the battery management system; a target slave node selection module configured to select a target slave node from the plurality of slave nodes, wherein the target slave node is a slave node that communicates normally with both the master node and the fault slave node; a first transmission module configured to transmit frequency conversion information to the target slave node, so that the target slave node forwards the frequency conversion information to the fault slave node, and the fault slave node performs a frequency conversion based on the frequency conversion information; and an information transmission module configured to transmit information with the fault slave node using a frequency after the frequency conversion.

According to yet another aspect of the embodiments of the present disclosure, there is provided an apparatus for transmitting information in a battery management system. The apparatus may include: a first reception module configured to receive frequency conversion information transmitted by a master node in the battery management system; and a second transmission module configured to forward the frequency conversion information to a fault slave node, so that the fault slave node performs a frequency conversion based on the frequency conversion information, and the master node transmits information with the fault slave node using a frequency after the frequency conversion, wherein the fault slave node is a slave node, determined by the master node from a plurality of slave nodes, that communicates abnormally with the master node.

According to yet another aspect of the embodiments of the present disclosure, there is provided an apparatus for transmitting information in a battery management system. The apparatus may include: a second reception module configured to receive frequency conversion information transmitted by a target slave node, wherein the target slave node is a slave node selected from a plurality of slave nodes by a master node in the battery management system, and the target slave node is a slave node that communicates normally with both the master node and a fault slave node, and wherein the fault slave node is a slave node, determined by the master node from the plurality of slave nodes, that communicates abnormally with the master node; and a frequency conversion module configured to perform a frequency conversion based on the frequency conversion information, so that the master node uses a frequency after the frequency conversion to transmit information with the fault slave node.

According to yet another aspect of the embodiments of the present disclosure, there is provided a battery management system. The battery management system may include the apparatus for transmitting information in a battery management system according to various aspects described above.

BRIEF DESCRIPTION OF THE DRAWINGS

In order to illustrate technical solutions of the embodiments of the present disclosure more clearly, drawings that need to be used in the embodiments of the present disclosure will be briefly introduced below. For those ordinary skilled in the art, other drawings can be obtained from these drawings without any creative work.

DETAILED DESCRIPTION

The features and exemplary embodiments of the various aspects of the present disclosure will be described in detail below. In order to make objects, technical solutions and advantages of the present disclosure more comprehensible, the present disclosure will be further described in detail below with reference to the drawings and embodiments. It should be understood that the specific embodiments described herein are intended to be illustrative only and not to limit the present disclosure. For those skilled in the art, the present disclosure may be practiced without some of these specific details. The following description of embodiments is only provided, by illustrating examples of the present disclosure, for a better understanding of the present disclosure.

It should be noted that, in the present disclosure, relational terms such as first, second, etc. are merely used to distinguish one entity or operation from another entity or operation, and do not necessarily require or imply there is any such actual relationship or order among these entities or operations. Furthermore, terms such as "comprising", "including" or any other variations thereof are intended to encompass a non-exclusive inclusion, such that a process, method, article, or device that comprises a plurality of elements may include not only these elements but also other elements that are not listed explicitly, or may further include elements that are inherent to such a process, method, article, or device. An element defined by a phrase "comprising . . . " does not exclude the presence of an additional same element in the process, method, article, or device that comprises the element, without further limitation.

A system for transmitting information in a battery management system according to an embodiment of the present disclosure will first be described in detail below with reference to the drawings.

Figure 1:
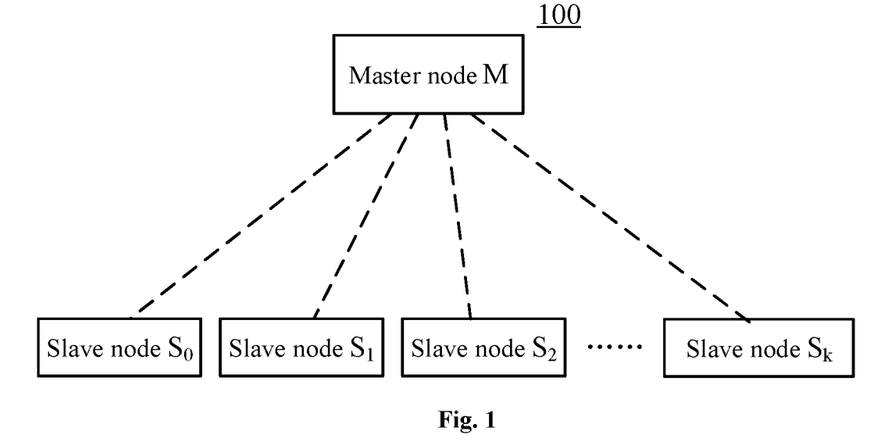
FIG. 1 illustrates a schematic structural diagram of a battery management system according to an embodiment of the present disclosure.

FIG. 1 illustrates a schematic structural diagram of a battery management system 100 according to an embodiment of embodiments of the present disclosure. Referring to FIG. 1, the battery management system may include a master node M and a plurality of slave nodes $S_0$, $S_1$, $S_2 \ldots S_k$, wherein k is a positive integer greater than or equal to 1. Dotted lines in FIG. 1 may represent that the master node M and each slave node may transmit information wirelessly.

The master node M may store communication frequencies of each slave node in the battery management system, so that the master node M and each slave node may achieve data interaction through a certain communication frequency, and communication between the master node M and each slave node may be independent. As an example, the master node M may interact with a slave node $S_j$ through a frequency $f_j$, where j=0, 1, 2 . . . k. There is no limit on a relationship among the k+1 frequencies of $f_0$, $f_1$, $f_2 \ldots f_k$, and they may be equal or unequal.

In an embodiment of the present disclosure, both the master node and each slave node in the battery management system may have a storage space for storing frequencies of all slave nodes in the battery management system, to achieve data transmission between any two slave nodes.

In the battery management system, when the master node and the slave nodes transmit information, due to the influence of factors such as external environment, structural layout or structural components, the master node may fail to transmit information with a certain slave node, that is, abnormal communication occurs.

In an embodiment, if the master node M transmits information to the slave node $S_0$ at the frequency $f_0$, but the master node M has not received feedback information from the slave node $S_0$ within a preset time period, then the master node M may determine that communication with the slave node $S_0$ is abnormal, that is, the slave node $S_0$ may be determined as a fault slave node.

In the battery management system according to an embodiment of the present disclosure, when the master node determines that there is a fault slave node that communicates abnormally with the master node among the plurality of slave nodes in the battery management system, a target slave node may be selected from the plurality of slave nodes, and frequency conversion information may be transmitted to the target slave node. The target slave node may forward the frequency conversion information to the fault slave node, and then the fault slave node may perform frequency conversion based on the frequency conversion information. The master node may use a frequency after the frequency conversion to transmit information with the fault slave node successfully, thereby automatically recovering information transmission between the master node and the fault slave node, and improving the reliability of transmitting information in the battery management system.

Figure 2:
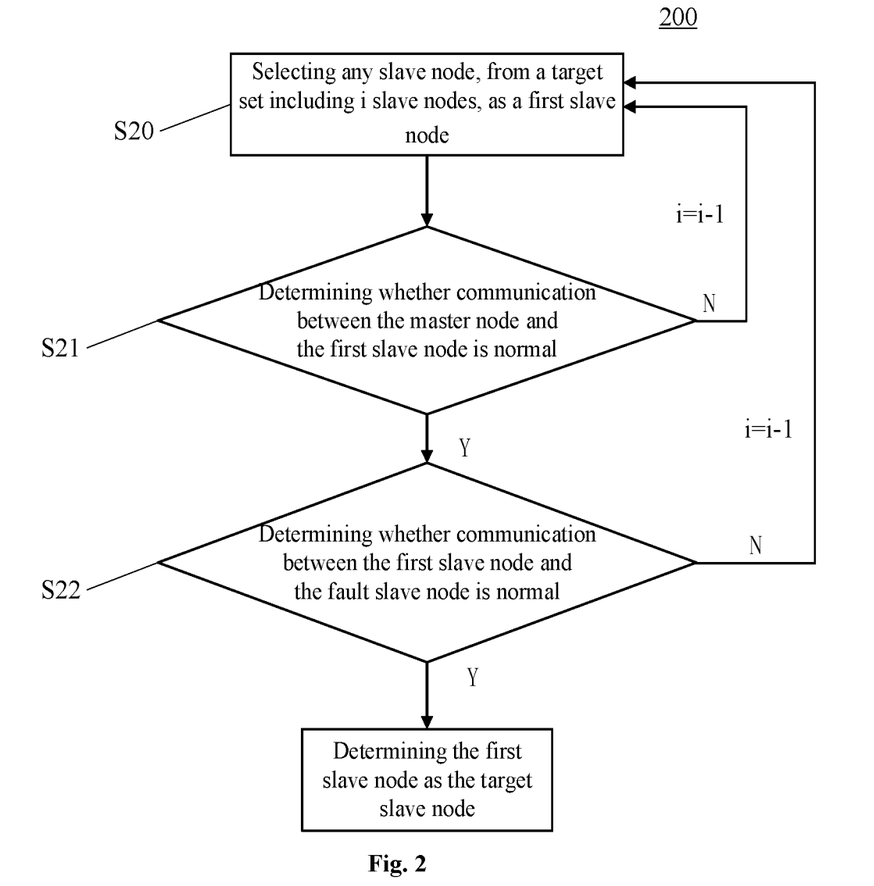
FIG. 2 illustrates a schematic flow chart of selecting a target slave node by a master node according to an embodiment of the present disclosure.

In an embodiment of the present disclosure, the target slave node may be a slave node that may communicate normally with both the master node and the fault slave node. FIG. 2 illustrates a schematic flow chart 200 of selecting a target slave node by a master node according to an embodiment of the present disclosure. As shown in FIG. 2, in this embodiment, a method for a master node to select a target node from a plurality of slave nodes may include the following steps.

In step S20, the master node may select any slave node, from a target set including i slave nodes, as a first slave node.

In an embodiment of the present disclosure, the target set may be a set of all slave nodes among the plurality of slave nodes in the battery management system except a fault slave node determined by the master node, wherein i may be a positive integer greater than 1. That is to say, the master node may select, from the plurality of slave nodes in the battery management system, any slave node other than the fault slave node as the first slave node.

As an example, the battery management system may include slave nodes $S_0, S_1, S_2 \ldots S_k$, namely, may include k+1 slave nodes. If the slave node $S_0$ is a fault slave node, then the target set may include k slave nodes, namely, slave nodes $S_1, S_2 \ldots S_k$.

In step S21, whether communication between the master node and the first slave node is normal may be determined.

In an embodiment of the present disclosure, if communication between the master node and the first slave node is normal, then the method may proceed to step S22.

If communication between the master node and the first slave node is abnormal, then i=i–1. The master node may reselect the first slave node in the target set including i–1 slave nodes. The target set including i–1 slave nodes may be obtained by removing the slave node selected in step S20 from the target set including i slave nodes.

As an example, the master node may select the slave node $S_1$, from the target set including the slave nodes $S_1, S_2 \ldots S_k$, as the first slave node. If communication between the slave node $S_1$ and the master node is abnormal, then the master node may reselect, from the target set excluding the slave node $S_1$ (namely the target set including $S_2, S_3 \ldots S_k$), any slave node as the first slave node.

In step S22, whether communication between the first slave node and the fault slave node is normal may be determined.

In an embodiment of the present disclosure, if communication between the first slave node and the fault slave node is normal, that is, the first slave node may communicate normally with both master node and the fault slave node, the first slave node may be determined as the target slave node.

In an embodiment of the present disclosure, since the failure slave node may maintain, within a preset time period, a frequency f at which abnormal communication with the master node occurs, the following situation may occur: communication between the master node and the selected first slave node is normal, however, the first slave node communicates abnormally with the fault slave node using the frequency f. In this case, the master node fails to transmit frequency conversion information to the fault slave node through the first slave node, causing that the master node fails to modify the frequency of the fault slave node. At this time, the first slave node may transmit to the master node a signal indicating that frequency conversion fails, then i=i–1, and the master node may reselect the first slave node.

That is, if the first slave node communicates abnormally with at least one of the master node and the fault slave node, the master node may reselect the first slave node.

In the above examples, if communication between the master node M and the slave node $S_1$ is normal, and communication between the slave node $S_1$ and the slave node $S_0$ is normal, then the slave node $S_1$ may be determined as the target slave node.

If communication between the master node M and the slave node $S_1$ is normal, and communication between the slave node $S_1$ and the slave node $S_0$ is abnormal, then the slave node $S_1$ cannot be determined as the target slave node. The master node may reselect $S_2$ as the first slave node among slave nodes excluding the slave node $S_0$ and the slave node $S_1$, that is, among nodes $S_2, S_3, \ldots S_k$.

Then, the master node may continue to determine whether the updated first slave node, namely, the slave node $S_2$, is able to communicate with the master node M normally. That is, the steps S20-S22 may be repeated until it is determined whether there is a target slave node among the slave nodes $S_1, S_2 \ldots S_k$.

In an embodiment of the present disclosure, if the master node succeeds in selecting the target slave node from the plurality of slave nodes, then the master node may transmit the frequency conversion information to the target slave node. The frequency conversion information may be information determined by the master node based on a frequency table of the fault slave node, and the frequency conversion information may include a new frequency that the fault slave node needs to convert to. The target slave node may receive the frequency conversion information transmitted by the master node, and forward the frequency conversion information to the fault slave node.

In an embodiment of the present disclosure, the master node may communicate with the target slave node using a certain frequency in a frequency table of the target slave node, so that the target slave node may receive the frequency conversion information transmitted by the master node. A frequency table of a node may include a plurality of frequencies at which the node can transmit information.

In an embodiment of the present disclosure, the target slave node may communicate with the fault slave node using a frequency at which abnormal communication between the fault slave node and the master node occurs. The fault slave node may receive the frequency conversion information transmitted by the target slave node, and perform frequency conversion based on the frequency conversion information.

Figure 3:
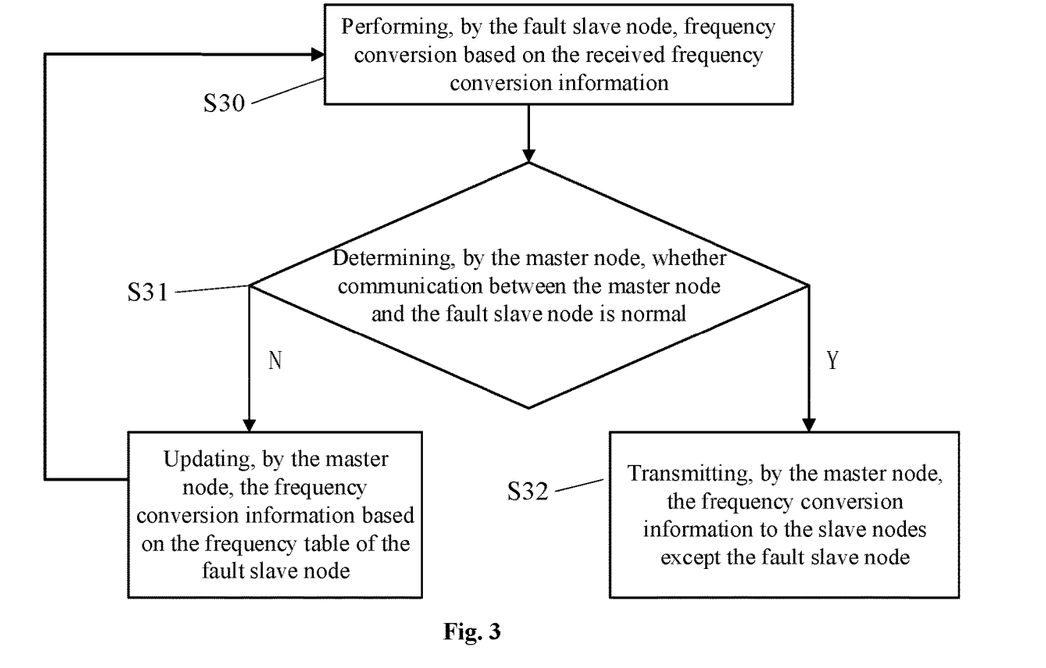
FIG. 3 illustrates a schematic flow chart of a method for a fault slave node to perform frequency conversion based on frequency conversion information according to an embodiment of the present disclosure.

A method for a fault slave node to perform frequency conversion based on frequency conversion information will be described in detail below in conjunction with an embodiment. FIG. 3 illustrates a method 300 for a fault slave node to perform frequency conversion based on frequency conversion information according to an embodiment of the present disclosure. The method may include the following steps.

In step S30, the fault slave node may perform frequency conversion based on the received frequency conversion information.

In an embodiment of the present disclosure, the frequency conversion information may include a frequency that the fault slave node needs to convert to, and the frequency may be any frequency among the frequency table of the fault slave node other than a frequency when abnormal communication between the fault slave node and the master node occurs.

As an example, a frequency table of the slave node $S_0$ above may include a frequency $f_0$, a frequency $f_{01}$, ..., a frequency $f_{0h}$, wherein h may be a positive integer. If abnormal communication occurs when the master node M and the slave node $S_0$ transmit information at the frequency $f_0$, it is determined that the fault slave node is the slave node $S_0$. It may be assumed that the master node M selects, from the slave nodes except the slave node $S_0$, the slave node $S_3$ as the target slave node.

The master node M may select, from frequencies in the frequency table of the slave node $S_0$ except the frequency $f_0$, the frequency $f_{01}$ as a new frequency included in the frequency conversion information. The master node M may forward the frequency conversion information including the frequency $f_{01}$ to the slave node $S_0$ through the slave node $S_3$. The slave node $S_0$ may convert the frequency $f_0$ to the frequency $f_{01}$ based on the frequency conversion information.

In step S31, the master node may determine whether communication between the master node and the fault slave node is normal.

In the above examples, if the master node M successfully transmits information with the slave node $S_0$ using the frequency $f_{01}$, then the method may proceed to step S32.

If the master node fails to transmit information with the slave node $S_0$ using the frequency $f_{01}$, then the method may proceed to step S33.

In step S32, the master node may transmit the frequency conversion information to the slave nodes except the fault slave node.

In the above examples, after the master node M successfully transmits information with the slave node $S_0$ using the frequency $f_{01}$, the master node M may transmit the frequency $f_{01}$ to the slave nodes $S_1, S_2, ..., S_k$. The slave nodes $S_1, S_2, ..., S_k$ may receive and store the frequency $f_{01}$.

In step S33, the master node may update the frequency conversion information based on the frequency table of the fault slave node.

In the above examples, if the master node fails to transmit information with the slave node $S_0$ using the frequency $f_{01}$, the master node may reselect any frequency from frequencies in the frequency table of the slave node $S_0$ except the frequency $f_0$ and the frequency $f_{01}$, and may determine the reselected frequency as the new frequency included in the frequency conversion information, to update the frequency conversion information. That is, if the master node fails to transmit information with the slave node $S_0$ using the frequency $f_{01}$, the method may return to step S30 to determine whether there is a frequency in the frequency table of the slave node $S_0$ that may enable information transmission between the master node M and the slave node $S_0$ to be successful.

When there is a frequency in the frequency table of the slave node $S_0$ that may enable information transmission between the master node M and the slave node $S_0$ to be successful, the master node may succeed in transmitting information with the fault slave node using a frequency after frequency conversion.

Moreover, the fault slave node may forward a feedback signal indicating success to the master node through the target slave node, and the master node may transmit the frequency that enables information transmission between the master node M and the slave node $S_0$ to be successful to all slave nodes among the plurality of slave nodes except the fault slave node.

All slave nodes except the fault slave node may receive and store the frequency of the fault slave node after frequency conversion transmitted by the master node, to achieve subsequent communication among the slave nodes.

In an embodiment of the present disclosure, the master node may change the frequency of the fault slave node by selecting a slave node that may communicate normally with both the master node and the fault slave node as a repeater, to achieve normal communication between the master node and the fault slave node. That is to say, the master node may automatically recover abnormal communication by utilizing slave nodes in the battery management system, thereby improving the reliability of wireless communication in the battery management system.

When there is no frequency in the frequency table of the slave node $S_0$ that may enable information transmission between the master node M and the slave node $S_0$ to be successful, the master node may forward data between the master node and the fault slave node using the target slave node.

Specifically, if the master node fails to transmit information with the fault slave node using the frequency after frequency conversion, application layer data of the fault slave node may be forwarded to the master node through the target slave node.

In the case that the master node fails to transmit information with the fault slave node using the frequency of the fault slave node after frequency conversion, the data between the master node and the fault slave node may be forwarded by using the selected target slave node as a repeater, to ensure indirect communication between the master node and the fault slave node, thereby further improving the reliability of wireless communication in the battery management system.

In an embodiment of the present disclosure, if the master node fails to receive a message transmitted by the fault slave node within a preset period, the master node may determine whether there is a target slave node in the plurality of slave nodes. If the master node fails to select the target slave node from the plurality of slave nodes (namely, the master node fails to communicate with any slave node), that is, there is no target slave node, the master node may perform a timed frequency hopping based on a preset frequency hopping rule, and may transmit information with the fault slave node using a frequency after the frequency hopping.

The fault slave node may automatically enter the timed frequency hopping after a first preset time period. The frequency hopping rule of the fault slave node may be consistent with the frequency hopping rule of the master node. In order to avoid a time delay between the fault slave node and the master node in entering the timed frequency hopping, a value of the first preset time period needs to be set. Specifically, the value of the first preset time period may be set to a time period required to complete polling all slave nodes by the master node and to determine that the target slave node does not exist, so as to ensure that a frequency of the fault slave node after the timed frequency hopping is consistent with a frequency of the master node after the timed frequency hopping.

In an embodiment of the present disclosure, if the master node determines that there is no target slave node in the plurality of slave nodes, the master node may perform a timed frequency hopping based on a preset frequency hopping rule. Correspondingly, the fault slave node may enter the timed frequency hopping almost simultaneously with the master node after the first preset time period. The preset frequency hopping rule may refer to a rule that the fault slave node converts its frequency at a fixed time interval based on a plurality of frequencies included in the frequency table of the fault slave node.

After the master node and the fault slave node perform a first frequency hopping, the master node and the fault slave node may attempt to transmit information based on a frequency after the first frequency hopping.

If information transmission between the master node and the fault slave node is successful, the master node may transmit the frequency after the frequency hopping to all slave nodes except the fault slave node.

If information transmission between the master node and the fault slave node fails, the master node and the fault slave node may continue to perform a second frequency hopping, and the master node and the fault slave node may attempt to transmit information based on a frequency after the second frequency hopping.

If information transmission between the master node and the fault slave node using the frequency after the second frequency hopping fails, the master node and the fault slave node may continue to perform a timed frequency hopping based on the preset frequency hopping rule, to determine whether there is a frequency for frequency hopping that may enable information transmission between the master node and the fault slave node to be successful within a range of the frequency table of the fault slave node.

If there is no frequency for frequency hopping that may enable information transmission between the master node and the fault slave node to be successful within the range of the frequency table of the fault slave node, the communication failure of the fault slave node may be reported.

In an embodiment of the present disclosure, before reporting a communication failure of the fault slave node, the frequency of the fault slave node may be changed using a selected target slave node, or data between the master node and the fault slave node may be forwarded through the target slave node, or the timed frequency hopping may be performed, so as to automatically recover normal communication between the master node and the fault slave node, thereby avoiding abnormal communication caused by factors such as external interference, a structural layout of nodes, etc., which improves the reliability of wireless communication.

In some embodiments of the present disclosure, within a time range allowed by an application layer, data may be transmitted in divided packets by reducing a size of a transmitted frame, i.e., by dividing a data packet. Since a short data packet may have a higher reliability than a long data packet, therefore the reliability of wireless communication in the battery management system may be improved.

Figure 4:
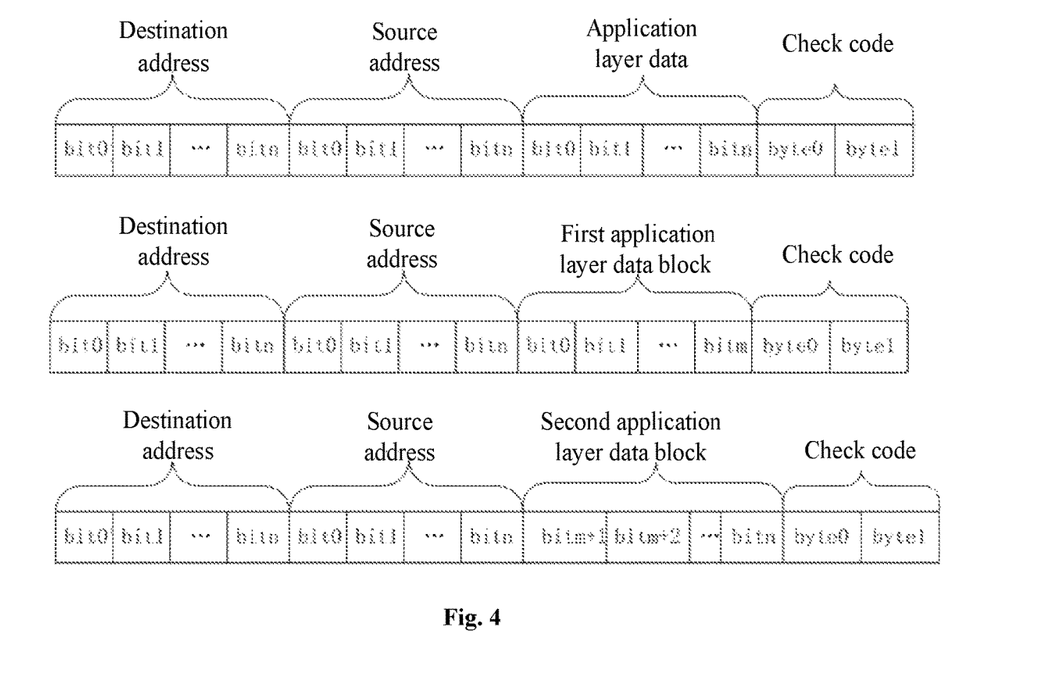
FIG. 4 illustrates a schematic diagram of a result of dividing a data packet according to an embodiment of the present disclosure.

As an example, FIG. 4 illustrates a schematic diagram of a result of dividing a data packet according to an embodiment of the present disclosure. The first row in FIG. 4 shows a format of a data packet to be transmitted, which may include a destination address, a source address, application layer data, and a check code of the data packet to be transmitted. The application layer data of the data packet to be transmitted may include n+1 bit data.

The application layer data in the data packet to be transmitted in the first row in FIG. 4 may be divided into a first application layer data block in the second row and a second application layer data block in the third row.

The first application layer data block in the second row may include the $1^{st}$ bit data to the $(m+1)^{th}$ bit data in the n+1 bit data of the application layer data in the first row. The second application layer data block in the third row may include the $(m+2)^{th}$ bit data to the $(n+1)^{th}$ bit data in the n+1 bit data of the application layer data in the first row.

Since the reliability of the short packets in the second row and the third row is higher than the reliability of the long packet in the first row, the reliability of wireless communication in the battery management system may be further improved.

The embodiments of the present disclosure does not specifically limit the dividing manner of the data packet, and the data packet may be divided into data packets of different numbers depending on an actual data length.

In some embodiments of the present disclosure, during transmission of data in the battery management system, a data verification mechanism may be provided at a transmitting end and a receiving end of the data. The receiving end of the data may use a preset verification mechanism to verify the received data. If the verification result is a verification failure, a feedback signal indicating the verification failure may be transmitted to the transmitting end, so that the transmitting end may perform data retransmission, that is, may retransmit the data to the receiving end.

In an embodiment of the present disclosure, data retransmission may ensure the integrity and correctness of data transmission, thereby further improving the reliability of wireless communication in the battery management system.

Figure 5:
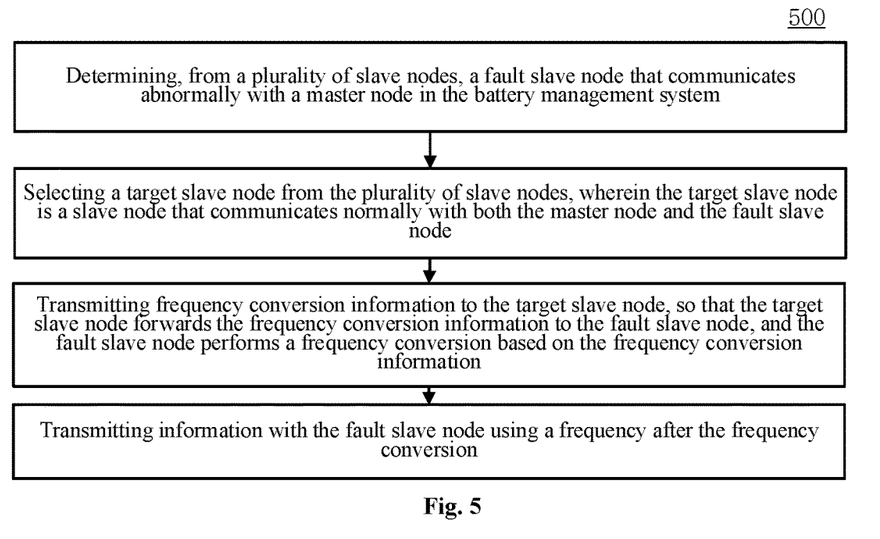
FIG. 5 illustrates a schematic flow chart of a method for transmitting information in a battery management system according to an embodiment of the present disclosure.

Based on the above process, a method for wirelessly transmitting information in the battery management system applied to a master node side according to an embodiment of the present disclosure may be summarized as the steps shown in FIG. 5. FIG. 5 illustrates a schematic flow chart of a method 500 for transmitting information in a battery management system applied to a master node side according to an embodiment of the present disclosure. As shown in FIG. 5, the method for wirelessly transmitting information in the battery management system according to an embodiment of the present disclosure may include the following steps.

In step S510, a fault slave node that communicates abnormally with a master node in the battery management system may be determined from a plurality of slave nodes.

In step S520, a target slave node may be selected from the plurality of slave nodes, wherein the target slave node may be a slave node that may communicate normally with both the master node and the fault slave node.

In step S530, frequency conversion information may be transmitted to the target slave node, so that the target slave node may forward the frequency conversion information to the fault slave node, and the fault slave node may perform a frequency conversion based on the frequency conversion information.

In step S540, a frequency after the frequency conversion may be used to transmit information with the fault slave node.

In an embodiment of the present disclosure, step S520 may include the following steps.

In step S5201, any slave node other than the fault slave node may be selected from the plurality of slave nodes as a first slave node.

In step S5202, the first slave node may be determined as the target slave node, if the first slave node may communicate normally with both the master node and the fault slave node. The first slave node may be reselected if the first slave node communicates abnormally with at least one of the master node and the fault slave node.

In some embodiments of the present disclosure, if transmission of information with the fault slave node using the frequency after the frequency conversion is successful, the method for transmitting information in the battery management system may further include the following step.

In step S550, the frequency after the frequency conversion may be transmitted to all slave nodes of the plurality of slave nodes except the fault slave node.

In some embodiments of the present disclosure, if transmission of information with the fault slave node using the frequency after the frequency conversion fails, the method for transmitting information in the battery management system may further includes the following step.

In step S560, data between the master node and the fault slave node may be forwarded using the target slave node.

In some embodiments of the present disclosure, if the target slave node fails to be selected from the plurality of slave nodes, the method for transmitting information in the battery management system may further include the following step.

In step S570, a timed frequency hopping may be performed based on a preset frequency hopping rule, and a frequency after the frequency hopping may be used to transmit information with the fault slave node.

The frequency after the frequency hopping is consistent with a frequency of the fault slave node after a timed frequency hopping based on the preset frequency hopping rule.

Figure 6:
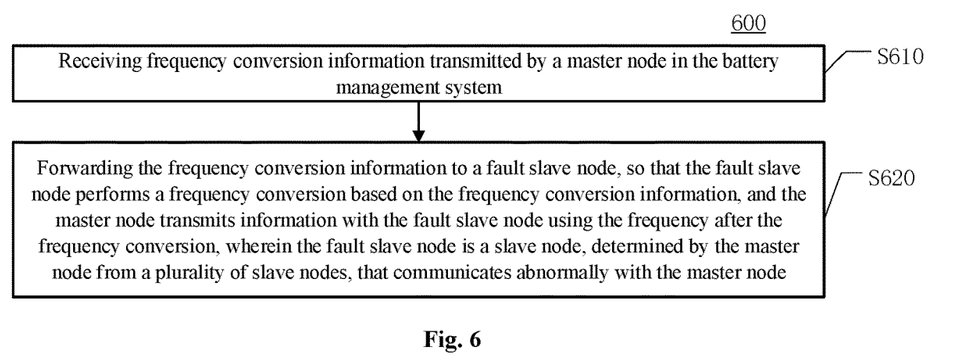
FIG. 6 illustrates a schematic flow chart of a method for transmitting information in a battery management system according to another embodiment of the present disclosure.

Based on the above process, a method for transmitting information in the battery management system applied to a target slave node side according to an embodiment of the present disclosure may be summarized as the steps shown in FIG. 6. FIG. 6 illustrates a schematic flow chart of a method 600 for transmitting information in a battery management system applied to a target slave node side according to an embodiment of the present disclosure. As shown in FIG. 6, the method for transmitting information in the battery management system according to an embodiment of the present disclosure may include the following steps.

In step S610, frequency conversion information transmitted by a master node in the battery management system may be received.

In step S620, the frequency conversion information may be forwarded to a fault slave node, so that the fault slave node may perform a frequency conversion based on the frequency conversion information, and the master node may transmit information with the fault slave node using the frequency after the frequency conversion.

The fault slave node may be a slave node, determined by the master node from a plurality of slave nodes, that communicates abnormally with the master node.

In some embodiments of the present disclosure, if the master node successfully transmits information with the fault slave node using the frequency after the frequency conversion, the method for transmitting information in the battery management system may further include the following step.

In step S630, the frequency after the frequency conversion transmitted by the master node may be received and stored.

In some embodiments of the present disclosure, if the master node fails to transmit information with the fault slave node using the frequency after the frequency conversion, the method for transmitting information in the battery management system may further include the following step.

In step S640, data between the master node and the fault slave node may be forwarded.

Figure 7:
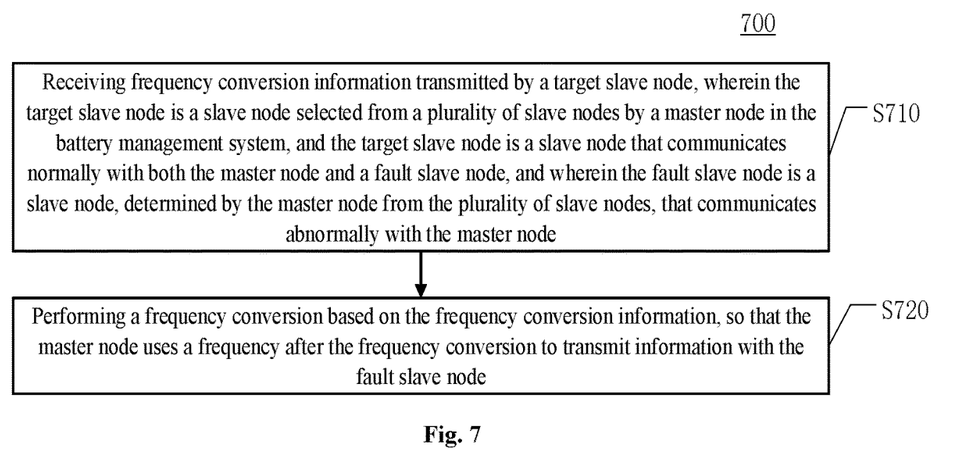
FIG. 7 illustrates a schematic flow chart of a method for transmitting information in a battery management system according to yet another embodiment of the present disclosure.

Based on the above process, a method for transmitting information in the battery management system applied to a fault slave node side according to an embodiment of the present disclosure may be summarized as the steps shown in FIG. 7. FIG. 7 illustrates a schematic flow chart of a method 700 for transmitting information in a battery management system applied to a fault slave node side according to an embodiment of the present disclosure. As shown in FIG. 7, the method for transmitting information in the battery management system according to an embodiment of the present disclosure may include the following steps.

In step S710, frequency conversion information transmitted by a target slave node may be received, wherein the target slave node may be a slave node selected from a plurality of slave nodes by a master node in the battery management system, and the target slave node may be a slave node that may communicates normally with both the master node and a fault slave node, and wherein the fault slave node may be a slave node, determined by the master node from the plurality of slave nodes, that communicates abnormally with the master node.

In step S720, a frequency conversion may be performed based on the frequency conversion information, so that the master node may use the frequency after the frequency conversion to transmit information with the fault slave node.

In some embodiments of the present disclosure, if the master node fails to transmit information with the fault slave node using the frequency after the frequency conversion, the method for transmitting information in the battery management system may further include the following step.

In step S730, data between the master node and the fault slave node may be forwarded using the target slave node.

In some embodiments of the present disclosure, if the master node fails to select the target slave node from the plurality of slave nodes, the method for transmitting information in the battery management system may further include the following step.

In step S740, a timed frequency hopping may be performed based on a preset frequency hopping rule within a preset time period, and a frequency after the frequency hopping may be used to transmit information with the master node.

The frequency after the frequency hopping is consistent with a frequency of the master node after a timed frequency hopping based on the preset frequency hopping rule.

In the method for transmitting information in a battery management system according to an embodiment of the present disclosure, by using a selected target slave node as a repeater, frequency conversion may be achieved or data between the master node and the fault slave node may be forwarded, thereby automatically recovering communication between the master node and the fault slave node, which may improve the reliability of communication in the battery management system.

It should be noted that, in an embodiment of the present disclosure, the number of fault slave nodes may be one or more. The number of fault slave nodes may be less than or equal to the number of slave nodes in the battery management system. When the number of fault slave nodes is more than one, the method for transmitting information in the battery management system according to an embodiment of the present disclosure may be used to select a target slave node for each fault slave node, so that the master node may recover communication with the fault slave node through the target slave node, thereby improving the reliability of wireless communication in the battery management system.

Figure 8:
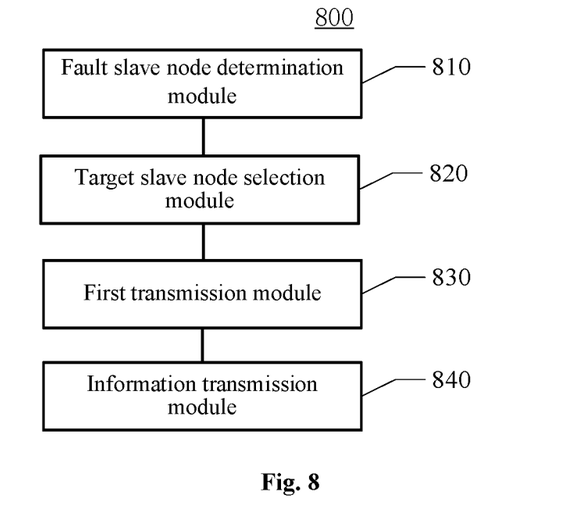
FIG. 8 is a schematic structural diagram of an apparatus for transmitting information in a battery management system according to an embodiment of the present disclosure.

FIG. 8 illustrates a schematic structural diagram of an apparatus 800 for transmitting information in a battery management system according to an embodiment of the present disclosure. The apparatus in FIG. 8 may perform the method in FIG. 5, and the apparatus may include: a fault slave node determination module 810 configured to determine, from a plurality of slave nodes, a fault slave node that communicates abnormally with a master node in the battery management system; a target slave node selection module 820 configured to select a target slave node from the plurality of slave nodes, wherein the target slave node may be a slave node that may communicate normally with both the master node and the fault slave node; a first transmission module 830 configured to transmit frequency conversion information to the target slave node, so that the target slave node may forward the frequency conversion information to the fault slave node, and the fault slave node may perform a frequency conversion based on the frequency conversion information; and an information transmission module 840 configured to transmit information with the fault slave node using a frequency after the frequency conversion.

Figure 9:
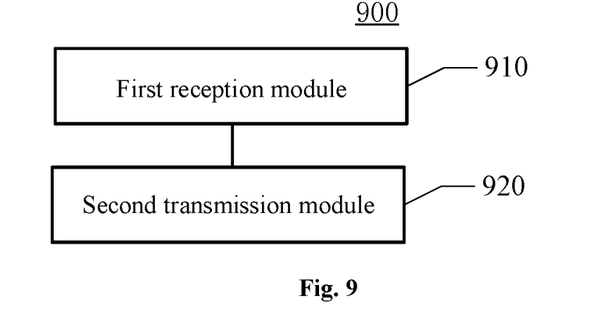
FIG. 9 is a schematic structural diagram of an apparatus for transmitting information in a battery management system according to another embodiment of the present disclosure.

FIG. 9 illustrates a schematic structural diagram of an apparatus 900 for transmitting information in a battery management system according to an embodiment of the present disclosure. The apparatus in FIG. 9 may perform the method in FIG. 6, and the apparatus may include: a first reception module 910 configured to receive frequency conversion information transmitted by a master node in the battery management system; and a second transmission module 920 configured to forward the frequency conversion information to a fault slave node, so that the fault slave node may perform a frequency conversion based on the frequency conversion information, and the master node may transmit information with the fault slave node using the frequency after the frequency conversion, wherein the fault slave node may be a slave node, determined by the master node from a plurality of slave nodes, that communicates abnormally with the master node.

Figure 10:
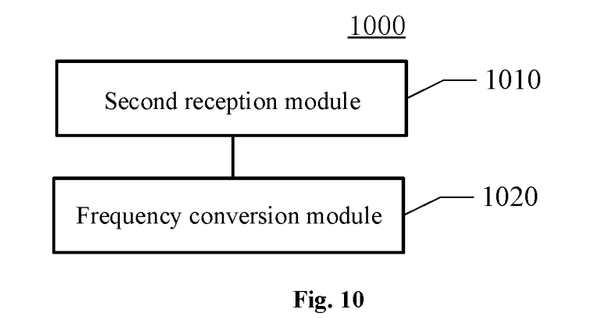
FIG. 10 is a schematic structural diagram of an apparatus for transmitting information in a battery management system according to yet another embodiment of the present disclosure.

FIG. 10 illustrates a schematic structural diagram of an apparatus 1000 for transmitting information in a battery management system according to an embodiment of the present disclosure. The apparatus in FIG. 10 may perform the method in FIG. 7, and the apparatus may include: a second reception module 1010 configured to receive frequency conversion information transmitted by a target slave node, wherein the target slave node may be a slave node selected from a plurality of slave nodes by a master node in the battery management system, and the target slave node may be a slave node that may communicate normally with both the master node and a fault slave node, and wherein the fault slave node may be a slave node, determined by the master node from the plurality of slave nodes, that communicates abnormally with the master node; and a frequency conversion module 1020 configured to perform a frequency conversion based on the frequency conversion information, so that the master node may use the frequency after the frequency conversion to transmit information with the fault slave node.

In the apparatus for transmitting information in the battery management system according to an embodiment of the present disclosure, the master node may transmit frequency conversion information to the fault slave node by using a selected target slave node, so that the fault slave node may perform frequency conversion based on the frequency conversion information, and thus the master node may recover communication with the fault slave node using a frequency after the frequency conversion, thereby improving the reliability of wireless communication in the battery management system.

Other details of the apparatus for transmitting information in the battery management system according to an embodiment of the present disclosure are similar to those of the method for transmitting information in the battery management system according to an embodiment of the present disclosure described above with reference to FIGS. 5 to 7, which will not be described herein again.

It should also be noted that the exemplary embodiments mentioned in the present disclosure describe some methods or systems based on a series of steps or devices. However, the present disclosure is not limited to the order of the above steps, that is, the steps may be performed in the order mentioned in the embodiments, or may be performed in an order different from the order in the embodiments, or several steps may be performed simultaneously.

The description above only refers to specific implementations of the present disclosure, and those skilled in the art can clearly understand that for the convenience and brevity of the description, specific operating processes of systems, modules and units described above can refer to corresponding processes in the foregoing method embodiments, which will not be repeated here. It should be understood that the scope of the present disclosure is not limited thereto, and various equivalent modifications or substitutions may be easily conceived by those skilled in the art within the scope of the present disclosure. Those modifications or substitutions should be covered by the scope of the present disclosure.

What is claimed is:

1. A method for transmitting information in a battery management system, comprising:
    determining, from a plurality of slave nodes, a fault slave node that communicates abnormally with a master node in the battery management system;
    selecting a target slave node from the plurality of slave nodes, wherein the target slave node is a slave node that communicates normally with both the master node and the fault slave node;
    transmitting frequency conversion information to the target slave node, so that the target slave node forwards the frequency conversion information to the fault slave node, and the fault slave node performs a frequency conversion based on the frequency conversion information; and
    transmitting information with the fault slave node using a frequency after the frequency conversion, wherein when transmission of information with the fault slave node using the frequency after the frequency conversion is successful, the method further comprises:
transmitting the frequency after the frequency conversion to all slave nodes of the plurality of slave nodes except the fault slave node.

2. The method of claim 1, wherein the selecting a target slave node from the plurality of slave nodes comprises:
selecting, from the plurality of slave nodes, any slave node other than the fault slave node as a first slave node;
determining the first slave node as the target slave node, when the first slave node communicates normally with both the master node and the fault slave node; and
reselecting the first slave node when the first slave node communicates abnormally with at least one of the master node and the fault slave node.

3. The method of claim 1, wherein when transmission of information with the fault slave node using the frequency after the frequency conversion fails, the method further comprises:
forwarding data between the master node and the fault slave node using the target slave node.

4. The method of claim 1, wherein the method further comprises:
determining that no target slave node is selected from the plurality of slave nodes;
performing a timed frequency hopping based on a preset frequency hopping rule, and transmitting information with the fault slave node using a frequency after the frequency hopping,
wherein the frequency after the frequency hopping is consistent with a frequency of the fault slave node after a timed frequency hopping based on the preset frequency hopping rule.

5. A method for transmitting information in a battery management system, comprising:
receiving frequency conversion information transmitted by a master node in the battery management system;
forwarding the frequency conversion information to a fault slave node, so that the fault slave node performs a frequency conversion based on the frequency conversion information, and the master node transmits information with the fault slave node using the frequency after the frequency conversion,
wherein the fault slave node is a slave node, determined by the master node from a plurality of slave nodes, that communicates abnormally with the master node,
wherein when the master node successfully transmits information with the fault slave node using the frequency after the frequency conversion, the frequency after the frequency conversion is transmitted by the master node to all slave nodes of the plurality of slave nodes except the fault slave node.

6. The method of claim 5, wherein when the master node successfully transmits information with the fault slave node using the frequency after the frequency conversion, the method further comprises:
receiving and storing the frequency after the frequency conversion transmitted by the master node.

7. The method of claim 5, wherein when the master node fails to transmit information with the fault slave node using the frequency after the frequency conversion, the method further comprises:
forwarding data between the master node and the fault slave node.

8. A method for transmitting information in a battery management system, comprising:
receiving frequency conversion information transmitted by a target slave node, wherein the target slave node is a slave node selected from a plurality of slave nodes by a master node in the battery management system, and the target slave node is a slave node that communicates normally with both the master node and a fault slave node, and wherein the fault slave node is a slave node, determined by the master node from the plurality of slave nodes, that communicates abnormally with the master node; and
performing a frequency conversion based on the frequency conversion information, so that the master node uses a frequency after the frequency conversion to transmit information with the fault slave node,
wherein when the master node fails to select the target slave node from the plurality of slave nodes, the method further comprises:
performing a timed frequency hopping based on a preset frequency hopping rule within a preset time period, and transmitting information with the master node using a frequency after the frequency hopping,
wherein the frequency after the frequency hopping is consistent with a frequency of the master node after a timed frequency hopping based on the preset frequency hopping rule.

9. The method of claim 8, wherein when the master node fails to transmit information with the fault slave node using the frequency after the frequency conversion, the method further comprises:
forwarding data between the master node and the fault slave node using the target slave node.

10. An apparatus for transmitting information in a battery management system, comprising:
a processor; and
a memory for storing instructions executable by the processor,
wherein the processor is configured to perform the method of claim 1.

11. An apparatus for transmitting information in a battery management system, comprising:
a processor; and
a memory for storing instructions executable by the processor,
wherein the processor is configured to perform the method of claim 5.

12. An apparatus for transmitting information in a battery management system, comprising:
a processor; and
a memory for storing instructions executable by the processor,
wherein the processor is configured to perform the method of claim 8.

13. A battery management system, comprising the apparatus for transmitting information in a battery management system according to claim 10, wherein the processor is further configured to:
receive frequency conversion information transmitted by the master node in the battery management system;
forward the frequency conversion information to the fault slave node, so that the fault slave node performs a frequency conversion based on the frequency conversion information, and the master node transmits information with the fault slave node using the frequency after the frequency conversion;

receive frequency conversion information transmitted by the target slave node; and perform a frequency conversion based on the frequency conversion information, so that the master node uses a frequency after the frequency conversion to transmit information with the fault slave node.

\* \* \* \* \*